(12) United States Patent
Nishimoto

(10) Patent No.: US 8,377,734 B2
(45) Date of Patent: Feb. 19, 2013

(54) METHOD FOR MANUFACTURING SOLAR BATTERY CELL

(75) Inventor: Yoichiro Nishimoto, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/132,187

(22) PCT Filed: Dec. 2, 2008

(86) PCT No.: PCT/JP2008/071901
§ 371 (c)(1),
(2), (4) Date: Jun. 1, 2011

(87) PCT Pub. No.: WO2010/064303
PCT Pub. Date: Jun. 10, 2010

(65) Prior Publication Data
US 2011/0237016 A1      Sep. 29, 2011

(51) Int. Cl.
*H01L 21/00* (2006.01)

(52) U.S. Cl. ....... 438/72; 438/48; 438/98; 257/E31.001; 257/E31.127

(58) Field of Classification Search .......... None
See application file for complete search history.

(56) References Cited

U.S. PATENT DOCUMENTS

| 7,170,001 | B2 * | 1/2007 | Gee et al. | 136/256 |
| 7,960,644 | B2 * | 6/2011 | Sinha | 136/258 |
| 8,076,175 | B2 * | 12/2011 | Meier et al. | 438/96 |
| 2004/0029334 | A1 | 2/2004 | Bijker et al. | |
| 2005/0172996 | A1 | 8/2005 | Hacke et al. | |
| 2008/0121280 | A1 * | 5/2008 | Carnel et al. | 136/258 |
| 2009/0050202 | A1 * | 2/2009 | Du et al. | 136/261 |
| 2009/0056798 | A1 * | 3/2009 | Merchant et al. | 136/256 |

(Continued)

FOREIGN PATENT DOCUMENTS

| CN | 101785113 A | 7/2010 |
| JP | 5-267696 A | 10/1993 |

(Continued)

OTHER PUBLICATIONS

International Search Report (PCT/ISA/210) issued on Mar. 10, 2009, by Japanese Patent Office as the International Searching Authority for International Application No. PCT/JP2008/071901.

(Continued)

*Primary Examiner* — Seahvosh Nikmanesh
*Assistant Examiner* — Evren Seven
(74) *Attorney, Agent, or Firm* — Buchanan Ingersoll & Rooney PC

(57) ABSTRACT

A method includes: a first step of forming a passivation film on a first surface of a crystalline silicon substrate of a first conductive type; a second step of diffusing an element of a second conductive type into a second surface of the crystalline silicon substrate by thermal diffusion to form a diffusion layer, whereby a pn junction is formed; a third step of forming an antireflection film on the diffusion layer; a fourth step of disposing a first electrode paste on the second surface of the crystalline silicon substrate; a fifth step of disposing a second electrode paste on the passivation film; and a sixth step of firing the first electrode paste and the second electrode paste to form electrodes.

7 Claims, 11 Drawing Sheets

U.S. PATENT DOCUMENTS

| | | | |
|---|---|---|---|
| 2009/0223560 A1* | 9/2009 | Kim | 136/256 |
| 2010/0015751 A1* | 1/2010 | Weidman et al. | 438/72 |
| 2010/0243041 A1* | 9/2010 | Carlson et al. | 136/255 |
| 2010/0326504 A1* | 12/2010 | Park et al. | 136/255 |
| 2011/0139243 A1* | 6/2011 | Shim et al. | 136/259 |
| 2011/0162706 A1* | 7/2011 | Borden et al. | 136/256 |
| 2011/0189810 A1* | 8/2011 | Rubin et al. | 438/72 |
| 2011/0237016 A1* | 9/2011 | Nishimoto | 438/72 |
| 2012/0048366 A1* | 3/2012 | Mai et al. | 136/256 |
| 2012/0199202 A1* | 8/2012 | Prajapati | 136/261 |

FOREIGN PATENT DOCUMENTS

| | | |
|---|---|---|
| JP | 9-045945 A | 2/1997 |
| JP | 2002-093722 A | 3/2002 |
| JP | 2002-270869 A | 9/2002 |
| JP | 2005-005280 A | 1/2005 |
| JP | 2005-183469 A | 7/2005 |
| JP | 2007-234641 A | 9/2007 |

OTHER PUBLICATIONS

Written Opinion (PCT/ISA/237) issued on Mar. 10, 2009, by Japanese Patent Office as the International Searching Authority for International Application No. PCT/JP2008/071901.

Schultz et al., "Thermal Oxidation Processes for High-Efficiency Multicrystalline Silicon Solar Cells", Jun. 2004, Proceedings of the 19th European Photovoltaic Solar Energy Conference.

Hofmann et al., "Silicon Nitride-Silicon Oxide Stacks for Solar Cell Rear Side Passivation", Jun. 2004, pp. 1037-1040, Proceedings of the 19th European Photovoltaic Solar Energy Conference.

McCann et al., "Angled Buried Contacts: A Front Contacting Scheme for High Efficiency Cells with Low Shading Losses", Jun. 2005, pp. 737-740, Proceedings of the 20th European Photovoltaic Solar Energy Conference.

Chinese Office Action, dated Nov. 21, 2012.

* cited by examiner

METHOD FOR MANUFACTURING SOLAR BATTERY CELL

TECHNICAL FIELD

The present invention relates to a method for manufacturing a solar battery cell, and in particular, to a method for manufacturing a solar battery cell in which a crystalline silicon substrate serving as a solar battery substrate has a passivated (inactivated) back surface.

BACKGROUND ART

To improve the efficiency of solar batteries, it is necessary to suppress recombination of carriers. In most crystalline silicon solar batteries currently commercially available, a high concentration diffusion layer of the same conductive type as that of the substrate of the solar battery is provided on the back surface of the substrate to remove minority carriers on the back surface of the substrate by the built-in potential of the junction, whereby recombination on the back surface of the substrate is suppressed. The high concentration diffusion layer on the back surface of the substrate is referred to as a BSF (Back Surface Filed) layer.

In a typical silicon solar battery, a combination of a p-type substrate and a BSF layer formed by diffusing aluminum (Al) into the back surface of the p-type substrate is used. More specifically, in such a typical silicon solar battery, an aluminum (Al) paste is printed on the back surface of the substrate and is then fired to form back surface electrodes, and aluminum (Al) is diffused into the back surface of the substrate to form a BSF layer (hereinafter denoted as an Al-BSF layer).

A recent increase in market size results in a shortage of silicon materials for solar batteries, and therefore their manufacturers are making efforts to reduce the thicknesses of the solar batteries. However, since the thermal expansion coefficients of silicon (Si) and an Al—Si alloy (an Al-BSF layer) are different, the warpage of a solar battery cell increases as the thickness of the silicon substrate decreases, and this affects the subsequent module production step. Therefore, the use of such an Al-BSF layer is quite inconvenient for thin silicon substrates.

Accordingly, development of back surface passivation technique as an alternative to the Al-BSF layer is in progress. In the field of single crystal silicon solar batteries, back surface passivation technique alternative to the Al-BSF layer has been developed to improve the efficiency of solar batteries, although this technique is still at a research level. PERC (Passivated Emitter and Rear Cell) cells and PERL (Passivated Emitter Rear Locally diffused) cells developed in University of New South Wales, Australia correspond to the above technique.

In these solar batteries, a silicon oxide film ($SiO_2$) is formed on the back surface of the silicon substrate by thermal oxidation to passivate the back surface of the silicon substrate. However, the step of forming the silicon oxide film ($SiO_2$) by thermal oxidation is a high temperature process at 1,000° C. or higher. Therefore, if this step is applied to polycrystalline silicon substrates, which are the mainstream in the current market, the quality of the crystals is impaired significantly, so that thermal oxidation cannot be applied to solar batteries that use polycrystalline silicon substrates.

In view of the above, Schultz et al. have achieved improvement in efficiency of a polycrystalline silicon solar battery by forming a silicon oxide film ($SiO_2$) on the back surface of the silicon substrate by wet oxidation at 800° C. to passivate the back surface of the silicon substrate (see, for example, Non-Patent Document 1). However, the oxidation time in the step of forming the silicon oxide film ($SiO_2$) by wet oxidation is several hours, and therefore the mass productivity of this process is not high.

Therefore, there is a need for a film especially for polycrystalline silicon solar batteries that can be formed by a low-temperature process and has high mass productivity and good passivation characteristics.

In polycrystalline silicon solar batteries, a silicon nitride film formed by PECVD (Plasma Enhanced Chemical Vapor Deposition) (an SiN film, hereinafter denoted as a PECVD-SiN film) is used as a front surface passivation film serving also as an antireflection film. This is because hydrogen contained in the PECVD-SiN film diffuses into grain boundaries during firing of electrodes and defects in the silicon substrate are passivated, so that the effect of improving conversion efficiency is thereby obtained. It is therefore natural to contemplate passivating the back surface of a silicon substrate using a PECVD-SiN film, and various research groups are studying the passivation with such a PECVD-SiN film.

PRIOR ART DOCUMENTS

Non-Patent Documents

Non-Patent document 1: O. Schultz et al., "THERMAL OXIDATION PROCESSES FOR HIGH-EFFICIENCY MULTICRYSTALLINE SILICON SOLAR CELLS," Proceedings of the 19th European Photovoltaic Solar Energy Conference, Paris, FRANCE, 7-11 Jun. 2004

Non-Patent document 2: M. Hofmann et al., "SILICON NITRIDE-SILICON OXIDE STACKS FOR SOLAR CELL REAR SIDE PASSIVATION," Proceedings of the 19th European Photovoltaic Solar Energy Conference, Paris, FRANCE, 7-11 Jun. 2004

Non-Patent document 3: M. M$^c$Cann, et al., "ANGLED BURIED CONTACTS: A FRONT CONTACTING SCHEME FOR HIGH EFFICIENCY CELLS WITH LOW SHADING LOSSES" Proceedings of the 20th European Photovoltaic Solar Energy Conference, Barcelona, Spain, 6-10 Jun. 2005, p. 737

DISCLOSURE OF INVENTION

Problem to be Solved by the Invention

Unfortunately, the back surface passivation technique for a silicon substrate using a PECVD-SiN film has not yet reached a practical level. One of the reasons is the influence of fixed charges in a PECVD-SiN film. Fixed charges are present in a PECVD-SiN film. Therefore, it is said that if a PECVD-SiN film is deposited on p-type silicon, an inversion layer is formed at the interface between the PECVD-SiN film and the p-type silicon, causing deterioration in the passivation characteristics at the interface. The use of a silicon-rich PECVD-SiN film (refractive index n>2.9) is said to reduce the influence of fixed charges. However, such a silicon-rich PECVD-SiN film (refractive index n>2.9) is rather a film that is close to amorphous silicon (a-Si) (see, for example, Non-Patent Document 2).

Both a PECVD-SiN film for an antireflection film and a silicon-rich PECVD-SiN film can be deposited by PECVD. However, the apparatus for depositing an amorphous silicon (a-Si) film for a solar battery is different from the apparatus for depositing a PECVD-SiN film for an antireflection film. Therefore, it is difficult to deposit both the films using a single apparatus (the PECVD apparatus for forming the antireflection film). If both the films can be deposited, it will be difficult to obtain stable characteristics.

When a silicon-rich PECVD-SiN film is used, the process of producing a solar battery is also complicated. An n-type diffusion layer must be prevented from intervening between the back surface of a silicon substrate and a passivation film. However, when phosphorus oxychloride ($POCl_3$) is used to form a diffusion layer (an n layer) on the front surface of a silicon substrate, an n-type diffusion layer is formed also on the back surface of the silicon substrate. When an Al-BSF layer is used, even if a diffusion layer is formed on the back surface of a silicon substrate, the diffusion layer on the back surface disappears due to the diffusion of aluminum (Al). Therefore, no particular problem arises if isolation is made at an end surface of the cell and the like area.

However, in a structure in which the back surface of a silicon substrate is passivated using an insulating film, only the n-type diffusion layer on the back surface must be removed. Hydrogen in a PECVD-SiN film desorbs at a temperature of 400° C. or higher. Therefore, if it is expected to achieve the passivation effect of hydrogen in a PECVD-SiN film on grain boundaries, it is necessary to perform a high-temperature process after the formation of the PECVD-SiN film in only a single step. In practice, it is necessary to perform only an electrode firing process.

In view of the above facts, the manufacturing process in which the back surface of a silicon substrate is passivated using a PECVD-SiN film is more complicated than the manufacturing process in which an Al-BSF layer is used.

Moreover, the removal of the diffusion layer on the back surface of the silicon substrate has a difficulty. More specifically, only the diffusion layer on the back surface of the silicon substrate must be removed. However, at present, no suitable method has been found. For example, when the diffusion layer on the back surface of a silicon substrate is removed by wet etching, only the back surface must be immersed in a chemical solution so that the chemical solution does not flow into the front surface of the silicon substrate. This operation is, however, very difficult.

In another possible method, after formation of diffusion layers, an antireflection film is formed before the diffusion layer on the back surface is removed, and the antireflection film is used as a mask to remove the diffusion layer on the back surface by etching. However, it is generally known that a PECVD-SiN film used as an antireflection film has pinholes. Therefore, if the entire silicon substrate is immersed in a chemical solution, the front-surface diffusion layer is removed in some regions. If front electrodes are formed on the regions from which the front-surface diffusion layer has been removed, leak paths are formed, and this causes deterioration in the properties of the solar battery (see, for example, Non-Patent Document 3).

The removal of the diffusion layer on the back surface of a silicon substrate by, for example, dry etching has problems such as low mass productivity, accumulation of etching residues on the back surface of the silicon substrate, and a high environmental load due to the use of chlorofluorocarbon gas.

The present invention has been made in view of the above circumstances, and it is an object of the invention to obtain a method for manufacturing a solar battery cell in which the back surface of a crystalline silicon substrate can be passivated (inactivated) using a PECVD-SiN film in a simple step to achieve improvement in photoelectric conversion efficiency.

Means for Solving Problem

In order to solve the above problem and in order to attain the above object, in a method for manufacturing a solar battery cell, the method of the present invention includes: a first step of forming a passivation film on a first surface of a polycrystalline silicon substrate of a first conductive type; a second step of diffusing an element of a second conductive type into a second surface of the crystalline silicon substrate by thermal diffusion to form a diffusion layer, whereby a pn junction is formed; a third step of forming an antireflection film on the diffusion layer; a fourth step of disposing a first electrode paste on the second surface of the crystalline silicon substrate; a fifth step of disposing a second electrode paste on the passivation film; and a sixth step of firing the first electrode paste and the second electrode paste to form electrodes.

Effect of the Invention

According to the present invention, a passivation film composed of a silicon nitride film is formed on one side of a polycrystalline silicon substrate by the plasma CVD method, and a diffusion layer is formed on the other side of the polycrystalline silicon substrate through a thermal diffusion step. Therefore, advantageously, a solar battery having high photoelectric conversion efficiency can be produced by passivating (inactivating) one side of a polycrystalline silicon substrate in a simple step.

BRIEF DESCRIPTION OF DRAWINGS

FIGS. 2-1 is a cross sectional view illustrating the schematic configuration of a solar battery cell produced by the method for manufacturing a solar battery cell according to the first embodiment of the present invention.

FIGS. 2-2 is an upper view illustrating the schematic configuration of the solar battery cell produced by the method for manufacturing a solar battery cell according to the first embodiment of the present invention.

FIGS. 2-3 is a bottom view illustrating the schematic configuration of the solar battery cell produced by the method for manufacturing a solar battery cell according to the first embodiment of the present invention.

FIGS. 3-1 is a cross sectional view illustrating a step of manufacturing a solar battery cell according to the first embodiment of the present invention.

FIGS. 3-2 is a cross sectional view illustrating the step of manufacturing a solar battery cell according to the first embodiment of the present invention.

FIGS. 3-3 is a cross sectional view illustrating the step of manufacturing a solar battery cell according to the first embodiment of the present invention.

FIGS. 3-4 is a cross sectional view illustrating the step of manufacturing a solar battery cell according to the first embodiment of the present invention.

FIGS. 3-5 is a cross sectional view illustrating the step of manufacturing a solar battery cell according to the first embodiment of the present invention.

FIG. 4 is a characteristic diagram showing the results of measurement of the open-circuit voltages Voc of solar battery cells.

FIG. 5 is a characteristic diagram showing the results of measurement of the short circuit photoelectric current densities Jsc of the solar battery cells.

Figure 1:
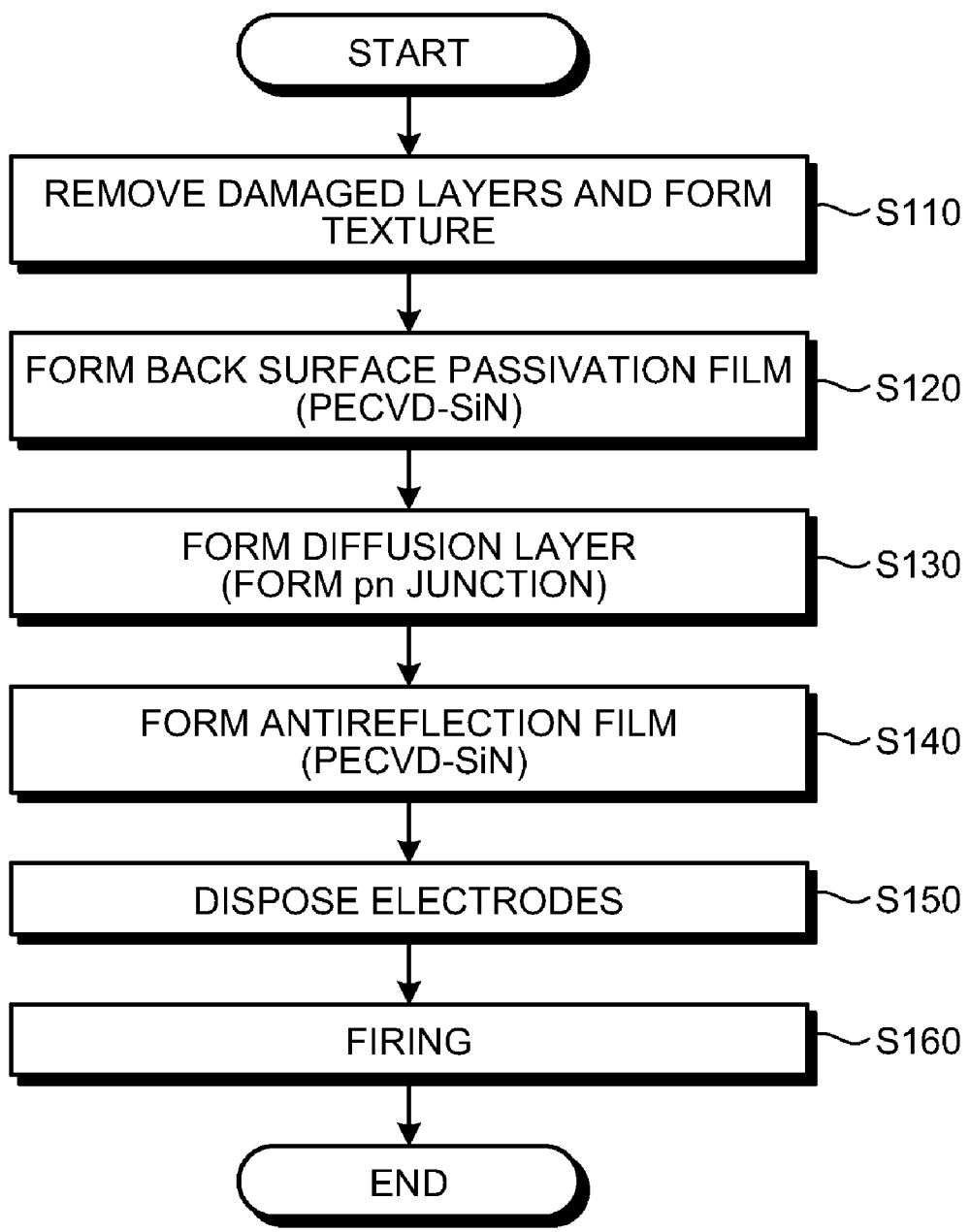
FIG. 1 is a flowchart describing a method for manufacturing a solar battery cell according to a first embodiment of the present invention.

EXPLANATIONS OF LETTERS OR NUMERALS 1 solar battery cell
11 semiconductor substrate
13 p-type polycrystalline silicon substrate
15 n-type diffusion layer
17 antireflection film
19 light receiving surface electrode
21 back surface passivation film
23 back surface electrode
25 front silver grid electrode
27 front silver bus electrode
31 n-type diffusion layer
111 semiconductor substrate
113 p-type polycrystalline silicon substrate
115 n-type diffusion layer
117 antireflection film
119 light receiving surface electrode
121 Al-BSF layer
123 back surface electrode
213 p-type polycrystalline silicon substrate
215 n-type diffusion layer

BEST MODES FOR CARRYING OUT THE INVENTION

Examples of a method for manufacturing a solar battery cell according to the present invention will next be described in detail with reference to the drawings. However, the present invention is not limited to the following description, and appropriate modifications may be made so long as they do not depart from the spirit of the invention. For ease of understanding, in the following drawings, the scales of the components may be different from the actual scales. The scales of the drawings may also be different from the actual scales.

First Embodiment

FIG. 1 is a flowchart describing the method for manufacturing a solar battery cell according to a first embodiment of the present invention. As shown in FIG. 1, the method for manufacturing a solar battery cell according to the present embodiment includes: a damaged layer removing and texture forming step (step S110); a back surface passivation film (PECVD-SiN) forming step (step S120); a diffusion layer forming (pn junction forming) step (step S130); an antireflection film (PECVD-SiN) forming step (step S140); an electrode disposing step (step S150); and a firing step (step S160).

Figures 1, 2:
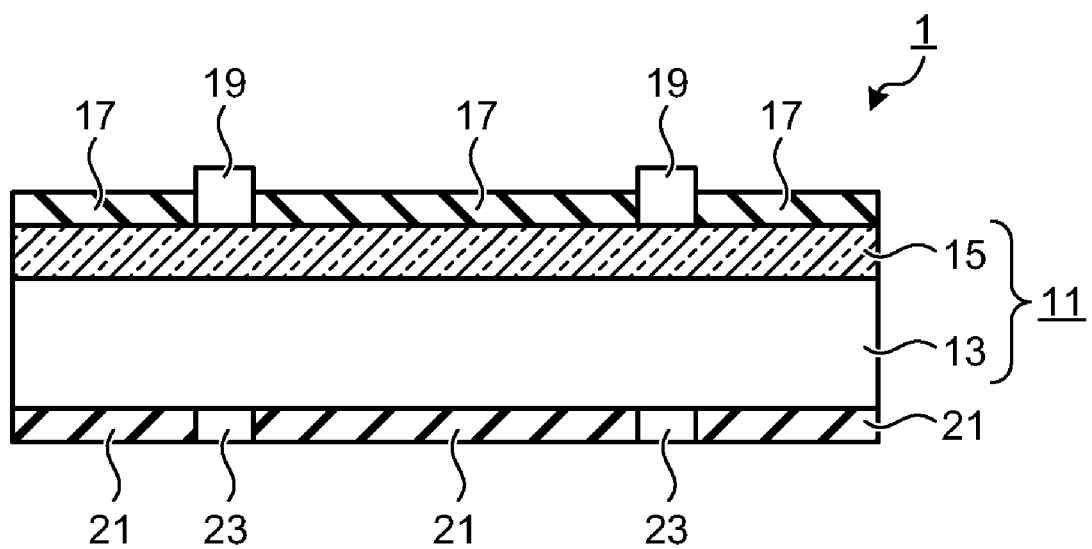
Figure 2:
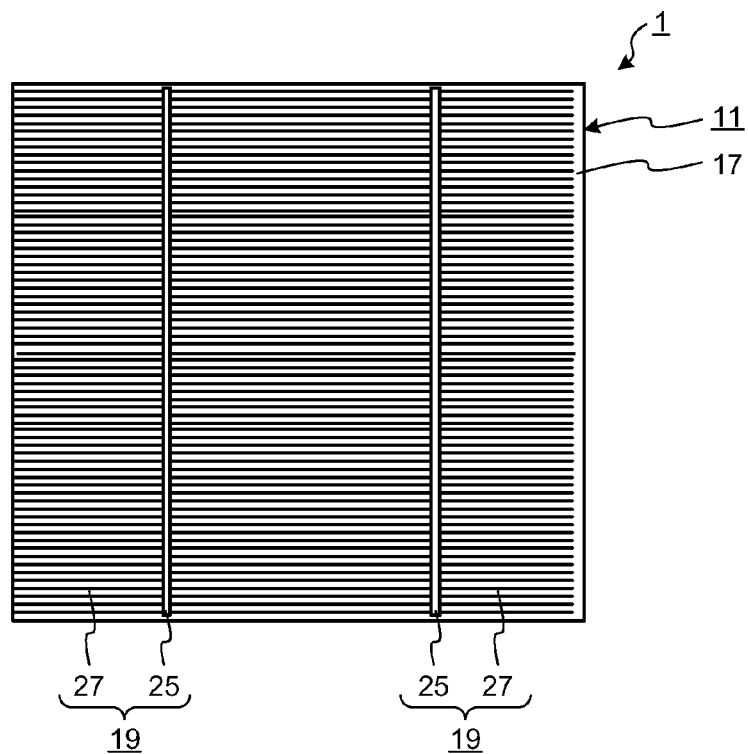
Figures 2, 3:
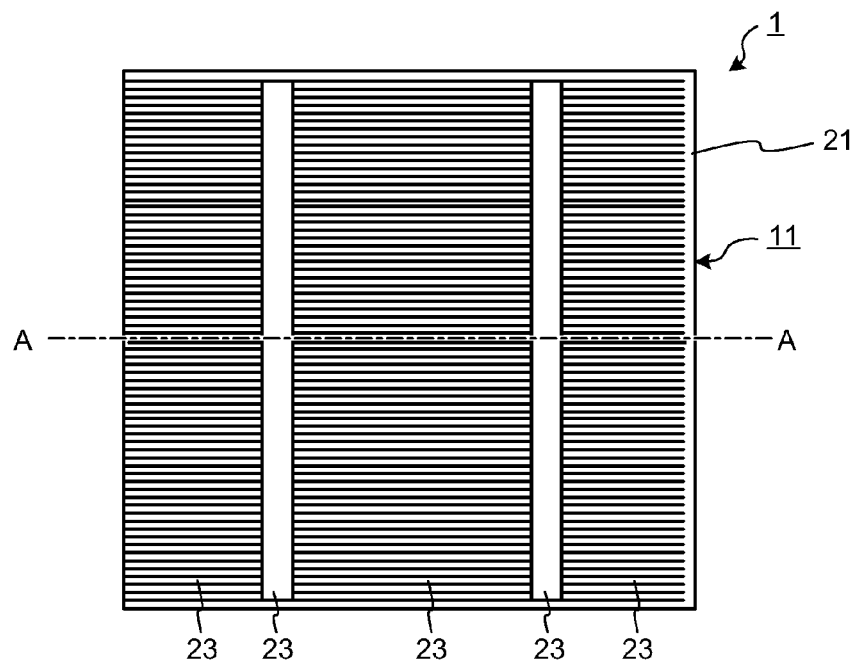

FIGS. 2-1 to 2-3 are diagrams illustrating the schematic configuration of a solar battery cell 1 produced by the method for manufacturing a solar battery cell according to the present embodiment. FIG. 2-1 is a cross sectional view of the solar battery cell 1, FIG. 2-2 is an upper view of the solar battery cell 1, as viewed from its light receiving surface side, and FIG. 2-3 is a bottom view of the solar battery cell 1 as viewed from the side opposite to the light receiving surface. FIG. 2-1 is a cross sectional view taken along line segment A-A in FIG. 2-3.

As shown in FIGS. 2-1 to 2-3, the solar battery cell 1 includes: a semiconductor substrate 11 that is a solar battery substrate having a photoelectric conversion function and has a pn junction; an antireflection film 17 that is formed on the light receiving surface (front surface) of the semiconductor substrate 11 and prevents reflection of incident light at the light receiving surface; light receiving surface electrodes 19 that are formed on the light receiving surface (front surface) of the semiconductor substrate 11 so as to be surrounded by the antireflection film 17; a back surface passivation film 21 formed on the surface opposite to the light receiving surface (on the back surface) of the semiconductor substrate 11; and back surface electrodes 23 formed on the back surface of the semiconductor substrate 11 so as to be surrounded by the back surface passivation film 21, the back surface electrodes 23 being provided for the purpose of extracting the electricity generated in the semiconductor substrate 11 and reflecting the incident light.

The semiconductor substrate 11 includes a p-type (first conductive type) polycrystalline silicon substrate 13 and an n-type (second conductive type) diffusion layer 15 formed by inverting the conductive type of the front surface of the p-type polycrystalline silicon substrate 13, and these form a pn junction. The light receiving surface electrodes 19 include front silver grid electrodes 25 and front silver bus electrodes 27 of the solar battery cell. The front silver grid electrodes 25 are disposed locally on the light receiving surface to collect the electricity generated in the semiconductor substrate 11. The front silver bus electrodes 27 are disposed substantially orthogonal to the front silver grid electrodes 25 to extract the electricity collected by the front silver grid electrodes 25. The back surface electrodes 23 are formed into a comb-like shape that is substantially the same as the electrode pattern of the light receiving surface electrodes 19.

A PECVD-SiN film formed by the PECVD method is used as the back surface passivation film 21.

In the solar battery cell 1 configured as above, when the pn junction plane of the semiconductor substrate 11 (the bonding surface between the p-type polycrystalline silicon substrate 13 and the n-type diffusion layer 15) is irradiated with sunlight from the light receiving surface side of the solar battery cell 1, holes and electrons are generated. The electric field at the pn junction causes the generated electrons to move toward the n-type diffusion layer 15 and the holes to move toward the p-type polycrystalline silicon substrate 13. Therefore, excess electrons are present in the n-type diffusion layer 15, and excess holes are present in the p-type polycrystalline silicon substrate 13. This causes photoelectromotive force. This photoelectromotive force is generated in a direction for forward biasing the pn junction. Therefore, the light receiving surface electrodes 19 connected to the n-type diffusion layer 15 serve as negative poles, and the back surface electrodes 23 connected to the p-type polycrystalline silicon substrate 13 serve as positive poles, so that a current flows into an external circuit (not shown).

In the solar battery cell configured as above according to the first embodiment, the PECVD-SiN film subjected to heat treatment is provided on the back surface opposite to the light receiving surface of the semiconductor substrate 11 and serves as the back surface passivation film 21. The back surface of the p-type polycrystalline silicon substrate 13 is thereby passivated in a reliable manner, and the solar battery cell has an open-circuit voltage and a short-circuit photoelectric current density that are comparable to those of a conventional solar battery cell having an Al-BSF layer. Therefore, in the solar battery cell according to the first embodiment, the back surface of the p-type polycrystalline silicon substrate 13 is passivated with the PECVD-SiN film without providing an Al-BSF layer to achieve high photoelectric conversion efficiency.

An example of the method for manufacturing the solar battery cell 1 will next be described with reference to FIGS. 3-1 to 3-5. FIGS. 3-1 to 3-5 are cross sectional views illustrating the steps of manufacturing the solar battery cell 1 according to the first embodiment.

First, as shown in FIG. 3-1, a p-type polycrystalline silicon substrate 13 used as the semiconductor substrate 11 is prepared. The p-type polycrystalline silicon substrate 13 is produced by slicing, with a wire saw, an ingot manufactured by cooling and solidifying molten silicon, and therefore the silicon substrate 13 has damaged surfaces generated when the substrate 13 is sliced. Therefore, the p-type polycrystalline silicon substrate 13 is immersed in a heated alkaline solution, for example, an aqueous sodium hydroxide solution to etch the surfaces so that the damaged layers are removed. More specifically, the damaged areas that are generated near the surfaces of the p-type polycrystalline silicon substrate 13 when the silicon substrate is cut are removed, and simultaneously a texture (not shown) is formed on the front surface of the p-type polycrystalline silicon substrate 13 (step S110).

Next, as shown in FIG. 3-2, a PECVD-SiN film serving as the back surface passivation film 21 is deposited on the back surface of the p-type polycrystalline silicon substrate 13 by the PECVD method (step S120). The back surface passivation film 21 deposited on the back surface of the p-type polycrystalline silicon substrate 13 is a passivation film for passivating the back surface of the p-type polycrystalline silicon substrate 13 and also serves as a diffusion mask for the back surface. More specifically, the back surface passivation film 21 serves also as a mask for preventing the formation of a diffusion layer on the back surface of the p-type polycrystalline silicon substrate 13 in the subsequent diffusion layer forming step. This PECVD-SiN film deposited has a refractive index n of 2.0 to 2.2 and a thickness of about 80 nm to about 90 nm.

The PECVD-SiN film having a refractive index n of 2.0 and deposited as the back surface passivation film 21 is a PECVD-SiN film having a refractive index comparable to that of the PECVD-SiN film used as the antireflection film 17 and can be deposited using an apparatus for forming the antireflection film 17. Therefore, the back surface passivation film 21 can be deposited using an existing apparatus, and a new capital investment is not required.

Next, this p-type polycrystalline silicon substrate 13 is heated in a phosphorus oxychloride ($POCl_3$) gas atmosphere at about 800° C. to about 900° C. to form an n-type diffusion layer 15 on the front surface of the p-type polycrystalline silicon substrate 13 as shown in FIG. 3-3, and a semiconductor pn junction is thereby formed (step S130). As described above, the main feature of the method for manufacturing a solar battery cell according to the first embodiment is that a texture is formed on the front surface of the p-type polycrystalline silicon substrate 13, then a PECVD-SiN film serving as the back surface passivation film 21 is formed on the back surface of the p-type polycrystalline silicon substrate 13, and then a diffusion layer is formed. In this manner, the PECVD-SiN film is tightly fired and becomes firm. Therefore, bonding properties between the silicon substrate and the PECVD-SiN film serving as the back surface passivation film are improved, and the passivation effect is thereby improved.

Figures 1, 3:
Figures 2, 3:
Figure 3:
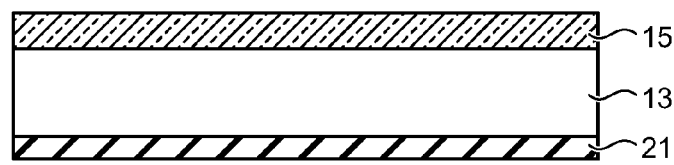
Figures 3, 4:
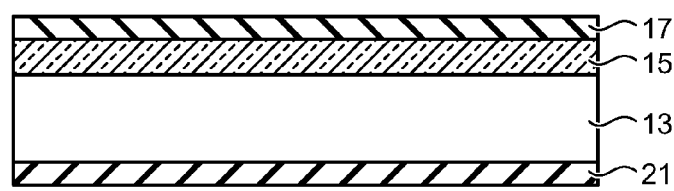

Next, as shown in FIG. 3-4, a silicon nitride film (PECVD-SiN film) serving as the antireflection film 17 is deposited on the front surface of the p-type polycrystalline silicon substrate 13 to a uniform thickness by the PECVD method (step S140). This antireflection film 17 also has a function of a passivation film for the front surface of the p-type polycrystalline silicon substrate 13.

Then the pattern for the light receiving surface electrodes 19, i.e., the pattern for the front silver grid electrodes 25 and the front silver bus electrodes 27, is screen-printed on the n-type diffusion layer 15 with a silver (Ag) paste, and the paste is dried at, for example, 100° C. to 300° C. to form the front silver grid electrodes 25 and the front silver bus electrodes 27 (unfired electrodes).

Next, the pattern for the back surface electrodes 23 is screed-printed on the back surface of the p-type polycrystalline silicon substrate 13 with an aluminum (Al) paste, and the paste was dried at 100° C. to 300° C. (step S150). If the back surface electrodes 23 are formed on the entire back surface of the p-type polycrystalline silicon substrate 13, the PECVD-SiN film serving as the back surface passivation film 21 is broken during firing, and the passivation effect is lost. Therefore, the pattern for the back surface electrodes 23 is a comb-like pattern similar to the patter for the light receiving surface electrodes 19.

Figures 3, 4, 5:
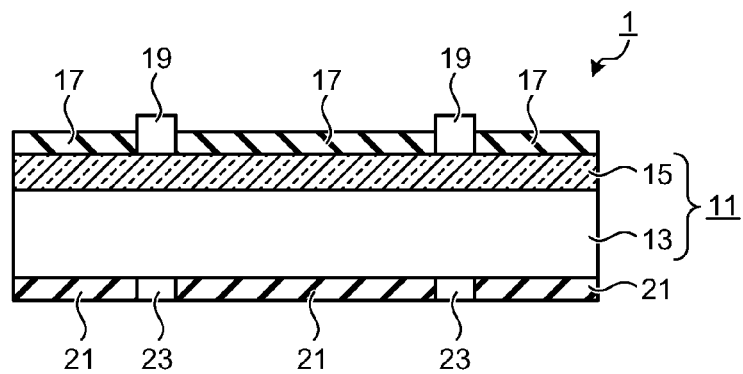
Figure 4:
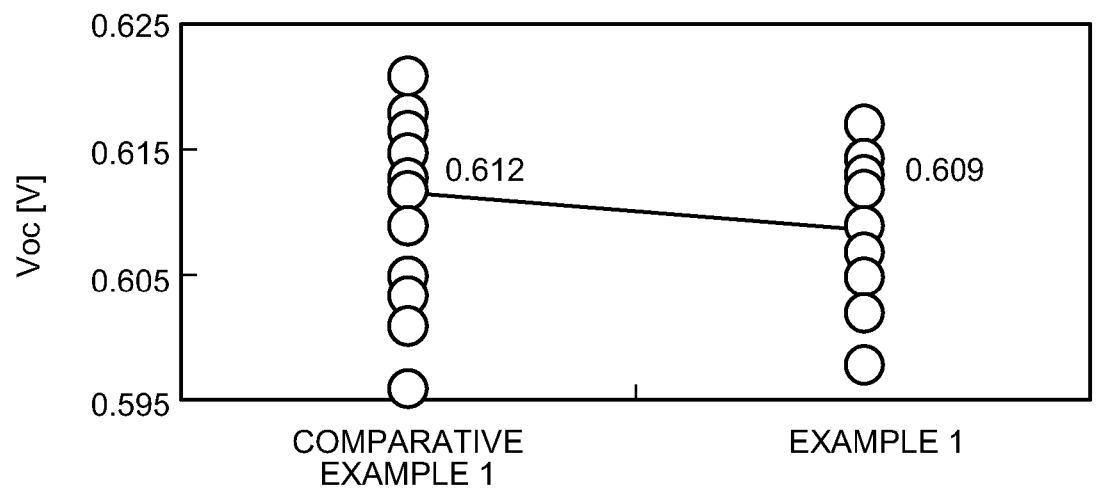
Figure 5:
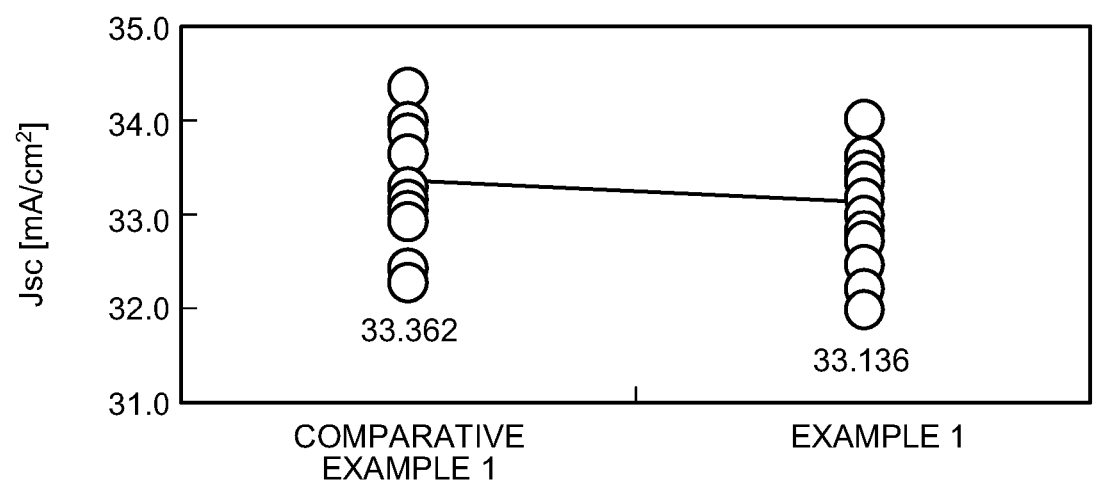

Then the p-type polycrystalline silicon substrate 13 is fired at, for example, 700° C. to 1,000° C. to form the back surface electrodes 23 as shown in FIGS. 3-5 and to fire the light receiving surface electrodes 19 (step S160).

By performing the above steps, the solar battery cell 1 according to the first embodiment shown in FIGS. 2-1 to 2-3 can be produced.

Next, a specific example will be described. Solar battery cells (Example 1) were actually manufactured by the above-described method for manufacturing a solar battery cell according to the first embodiment, and the properties of the solar battery cells were evaluated. A boron-doped p-type polycrystalline silicon substrate (15 cm square, thickness: 280 μm, resistivity: 1 Ωcm to 3 Ωcm) was used as the solar battery substrate. A PECVD-SiN film having a refractive index n of 2.0 and a thickness of 80 nm to 90 nm was deposited as the PECVD-SiN film serving as the back surface passivation film 21. The size of each solar battery cell was 4 $cm^2$.

These solar battery cells in Example 1 were used. Each solar battery cell was actually operated to measure its open-circuit voltage Voc (V) and its short-circuit photoelectric current density Jsc ($mA/cm^2$) as the solar battery output characteristics. The results are shown in FIGS. 4 and 5. FIG. 4 is a characteristic diagram showing the results of the measurement of the open-circuit voltages Voc (V) of the solar battery cells. FIG. 5 is a characteristic diagram showing the results of the measurement of the short-circuit photoelectric current densities Jsc (mA/cm$^2$) of the solar battery cells.

Figure 6:
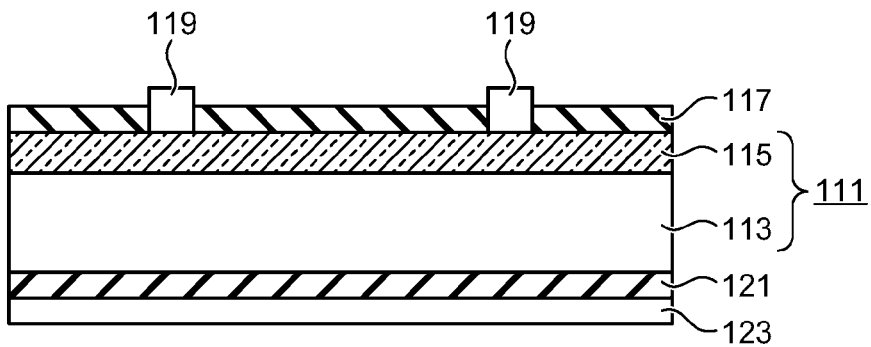
FIG. 6 is a cross sectional view illustrating the schematic configuration of a solar battery cell in Comparative Example 1.

Conventional solar battery cells (Comparative Example 1) each having an Al-BSF layer disposed on the back surface of a solar battery substrate, as shown in FIG. 6, were produced for comparison. FIG. 6 is a cross sectional view illustrating the schematic configuration of the solar battery cells in Comparative Example 1. The basic structure of the solar battery cells in Comparative Example 1 is the same as the structure of the solar battery cells in Example 1 except that the Al-BSF layer is provided instead of the back surface passivation film and that a back surface electrode is provided on substantially the entire back surface of the semiconductor substrate.

More specifically, as shown in FIG. 6, each solar battery cell in Comparative Example 1 includes: a semiconductor substrate 111 that is a solar battery substrate having a photoelectric conversion function and has a pn junction; an antireflection film 117 that is formed on the light receiving surface (front surface) of the semiconductor substrate 111 and prevents reflection of incident light at the light receiving surface; light receiving surface electrodes 119 that are formed on the light receiving surface (front surface) of the semiconductor substrate 111 so as to be surrounded by the antireflection film 117; and a back surface electrode 123 formed on substantially the entire back surface of the semiconductor substrate 11, the back surface electrode 123 being provided for the purpose of extracting the electricity generated in the semiconductor substrate 11 and reflecting the incident light.

The semiconductor substrate 111 includes: a p-type polycrystalline silicon substrate 113; an n-type diffusion layer 115 formed by inverting the conductive type of the front surface of the p-type polycrystalline silicon substrate 113; and an Al-BSF layer 121 containing impurities of high concentrations and disposed on the back surface of the p-type polycrystalline silicon substrate 113. The light receiving surface electrodes 119 include bus electrodes and grid electrodes of the solar battery cell, as in the solar battery cells in Example 1, and a cross sectional view taken in a direction substantially orthogonal to the lengthwise direction of the bus electrodes is shown in FIG. 6. The back surface electrode 123 is provided on substantially the entire back surface of the semiconductor substrate 111.

Figure 7:
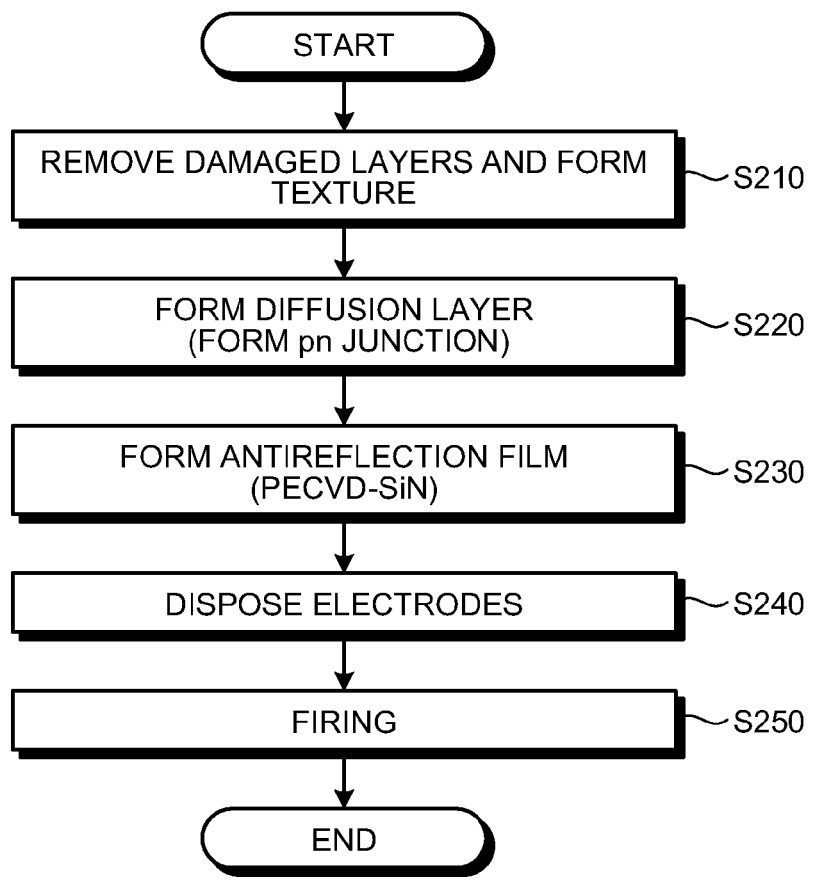
FIG. 7 is a flowchart describing a method for manufacturing a solar battery cell in Comparative Example 1.

Each solar battery cell in Comparative Example 1 was produced by a conventional process shown in FIG. 7. FIG. 7 is a flowchart describing the method for manufacturing the solar battery cell in Comparative Example 1. More specifically, a p-type polycrystalline silicon substrate 113 used as the solar battery substrate was prepared. The p-type polycrystalline silicon substrate 113 was immersed in a heated alkaline solution, for example, an aqueous sodium hydroxide solution to etch the surfaces. Damaged areas that were generated near the surfaces of the p-type polycrystalline silicon substrate 113 when the silicon substrate was cut were thereby removed, and a texture was formed simultaneously on the front surface of the p-type polycrystalline silicon substrate 113 (step S210).

Next, the p-type polycrystalline silicon substrate 113 was heated in a phosphorus oxychloride (POCl$_3$) gas atmosphere at about 800° C. to about 900° C. to form an n-type diffusion layer 115 on the front surface of the p-type polycrystalline silicon substrate 113, and a semiconductor pn junction was thereby formed (step S220).

Next, a silicon nitride film (PECVD-SiN film) serving as the antireflection film 117 was deposited on the front surface of the p-type polycrystalline silicon substrate 113 to a uniform thickness by the PECVD method (step S230).

Then the pattern for the light receiving surface electrodes 119, i.e., the pattern for the front silver grid electrodes and the front silver bus electrodes, was screen-printed on the n-type diffusion layer 115 with a silver (Ag) paste, and the paste was dried at, for example, 100° C. to 300° C. to form the front silver grid electrodes and the front silver bus electrodes (unfired electrodes). The pattern for the light receiving surface electrodes 119 was the same as that for the solar battery cells in Example 1.

Next, the pattern for the back surface electrode 123 was screen-printed on the back surface of the p-type polycrystalline silicon substrate 113 with an aluminum (Al) paste, and the paste was dried at 100° C. to 300° C. (step S240). Then the p-type polycrystalline silicon substrate 113 was fired at, for example, 700° C. to 1,000° C. to form the back surface electrode 123 and to diffuse aluminum (Al) into the back surface of the p-type polycrystalline silicon substrate 113, whereby the Al-BSF layer 121 was formed. At this time, the light receiving surface electrodes 119 were fired simultaneously (step S250).

By performing the above steps, the solar battery cells in Comparative Example 1 shown in FIG. 6 were produced. The size of each solar battery cell was 4 cm$^2$, which was the same as the size of the solar battery cells in Example 1.

These solar battery cells in Comparative Example 1 were used. Each solar battery cell was actually operated to measure its open-circuit voltage Voc (V) and its short-circuit photoelectric current density Jsc (mA/cm$^2$) as the solar battery output characteristics. The results are also shown in FIGS. 4 and 5.

The values in each of FIGS. 4 and 5 are average values, and these average values are connected by a straight line. As can be seen from FIGS. 4 and 5, the open-circuit voltage Voc (V) and the short-circuit photoelectric current density Jsc (mA/cm$^2$) of the solar battery cells in Example 1 were slightly lower than but substantially the same as those of the solar battery cells in Comparative Example 1. In other words, the results show that, in the method for manufacturing a solar battery cell according to the first embodiment, a solar battery cell having output characteristics comparable to those of the conventional solar battery cell including an Al-BSF layer can be produced. Therefore, it can be said that the method for manufacturing a solar battery cell according to the first embodiment is a back surface passivation technique alternative to the Al-BSF layer.

In previous studies by groups other than the present inventor, the number of heat treatment processes performed after deposition of a PECVD-SiN film on the back surface of a silicon substrate was limited to one (in fact, only an electrode firing process was performed) to achieve the passivation effect caused by hydrogen in the PECVD-SiN film. However, by performing the diffusing step after deposition of a PECVD-SiN film serving as the back surface passivation film on the back surface of the p-type polycrystalline silicon substrate, although the passivation effect caused by hydrogen in the PECVD-SiN film is abandoned, the entire process is instead simplified.

The above groups may have considered that the passivation effect caused by hydrogen in the PECVD-SiN film serving as the back surface passivation film is essential, and accordingly, it is considered that they limit the number of heat treatment processes performed after deposition of the PECVD-SiN film on the back surface to one. However, judging from the results described above, even when the passivation effect caused by hydrogen in the PECVD-SiN film on the back surface is absent, no problem arises in the output characteristics of the solar battery cells. This may be because grain boundaries are sufficiently passivated with hydrogen from the PECVD-SiN film, which serves as the antireflection film, on the front surface of the silicon substrate.

If a PECVD-SiN film is heated at high temperature, the rate of etching with hydrofluoric acid is significantly reduced. This may be because the PECVD-SiN film is tightly fired and becomes firm. Therefore, in the method for manufacturing a solar battery cell according to the first embodiment, the bonding properties between the PECVD-SiN film serving as the back surface passivation film and the silicon substrate are improved by the heating step of forming the diffusion layer, and the passivation effect is thereby improved. This may be one reason for the above results.

As described above, in the method for manufacturing a solar battery cell according to the first embodiment, the PECVD-SiN film serving as the back surface passivation film 21 is deposited on the back surface of the p-type polycrystalline silicon substrate 13, and then a pn junction is formed on the front surface of the p-type polycrystalline silicon substrate 13 in the heat diffusing step. The PECVD-SiN film used above is a film having a refractive index comparable to that of the PECVD-SiN film used as the antireflection film 17. With this method, the back surface of the p-type polycrystalline silicon substrate 13 can be reliably passivated, and a solar battery cell can be produced which exhibits characteristics comparable to those of the solar battery cell having the Al-BSF layer disposed on the back surface of the p-type polycrystalline silicon substrate 113 and has improved photoelectric conversion efficiency.

In the method for manufacturing a solar battery cell according to the first embodiment, since no Al-BSF layer is formed, the warpage problem of a solar battery cell that occurs when the silicon substrate is reduced in thickness can be solved. Therefore, a high efficiency solar battery can be produced which includes a reduced-thickness silicon substrate that contributes to a reduction in amount of raw material silicon and a reduction in power generation cost of the solar battery.

In the method for manufacturing a solar battery cell according to the first embodiment, since no back surface diffusion layer (n-type diffusion layer) is formed on the back surface of the p-type polycrystalline silicon substrate 13, the step of removing the back surface diffusion layer is not required, and the process can thereby be simplified, so that the solar battery can be efficiently manufactured. Moreover, since no chlorofluorocarbons etc. are used, the production process itself causes no environmental load. The back surface passivation film 21 is a PECVD-SiN film having a refractive index comparable to that of the PECVD-SiN film used as the antireflection film 17. Therefore, the back surface passivation film 21 can be produced using an existing apparatus, and a new capital investment is not required.

In the method for manufacturing a solar battery cell according to the first embodiment, a high-temperature process at 1,000° C. or higher, such as thermal oxidation, is not used. Therefore, a polycrystalline silicon solar battery having good photoelectric conversion characteristics can be produced without deterioration in crystal quality of the p-type polycrystalline silicon substrate 13.

As described above, it can be said that the method for manufacturing a solar battery cell according to the first embodiment is a method that is an alternative to the use of an Al-BSF layer and enables passivation of the back surface of a polycrystalline silicon substrate used as the solar battery substrate.

Second Embodiment

In a second embodiment, to examine the advantages of the method for manufacturing a solar battery cell according to the first embodiment, solar battery cells in Example 2 were produced using the same process as that for the solar battery cells in Example 1. The configuration of the solar battery cells in Example 2 was the same as that of the solar battery cells in Example 1, and the size of the solar battery cells was 4 cm². Solar battery cells in Comparative Example 2 were also produced, and the output characteristics were compared. The configuration of the solar battery cells in Comparative Example 2 was the same as that of the solar battery cells in Example 2, and the size of the solar battery cells was 4 cm², which was the same as the size of the solar battery cells in Example 2.

Figure 8:
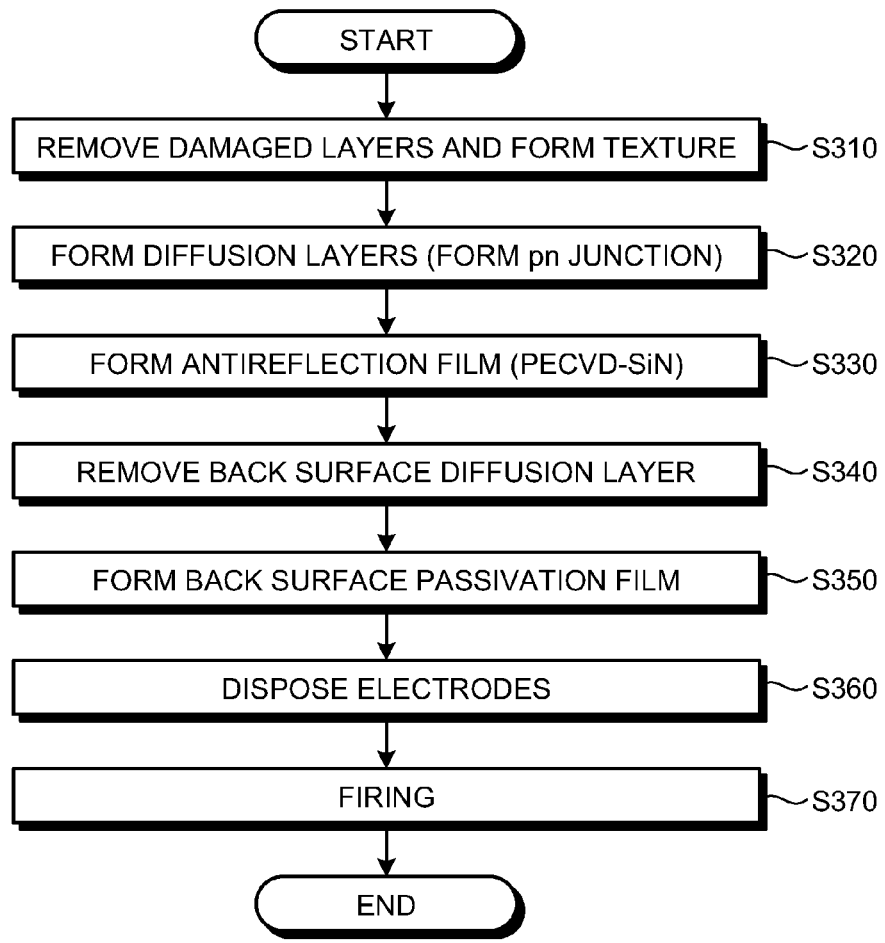
FIG. 8 is a flowchart describing a method for manufacturing a solar battery cell in Comparative Example 2.

The solar battery cells in Comparative Example 2 were produced by a conventional process shown in FIG. 8. FIG. 8 is a flowchart describing a method for manufacturing the solar battery cells in Comparative Example 2. More specifically, a p-type polycrystalline silicon substrate used as a solar cell substrate was prepared. The p-type polycrystalline silicon substrate was immersed in a heated alkaline solution, for example, an aqueous sodium hydroxide solution to etch the surfaces. Damaged areas that were generated near the surfaces of the p-type polycrystalline silicon substrate when the silicon substrate was cut were thereby removed, and simultaneously a texture was formed on the front surface of the p-type polycrystalline silicon substrate (step S310).

Next, the p-type polycrystalline silicon substrate was heated in a phosphorus oxychloride ($POCl_3$) gas atmosphere at about 800° C. to about 900° C. N-type diffusion layers were thereby formed on the surfaces of the p-type polycrystalline silicon substrate, and a semiconductor pn junction was also formed (step S320).

Next, a silicon nitride film (PECVD-SiN film) serving as the antireflection film was deposited on the front surface of the p-type polycrystalline silicon substrate to a uniform thickness by the PECVD method (step S330). Then the p-type polycrystalline silicon substrate was immersed in a chemical solution to remove the n-type diffusion layer formed on the back surface of the p-type polycrystalline silicon substrate (step S340).

Next, PECVD-SiN serving as the back surface passivation film was deposited on the back surface of the p-type polycrystalline silicon substrate by the PECVD method (step S350). A PECVD-SiN film having a refractive index n of 2.2 and a thickness of about 80 nm to about 90 nm was deposited as the above PECVD-SiN film.

Then the pattern for the light receiving surface electrodes, i.e., the pattern for the front silver grid electrodes and the front silver bus electrodes, was screen-printed on the n-type diffusion layer with a silver (Ag) paste, and the paste was dried at, for example, 100° C. to 300° C. to form the front silver grid electrodes and the front silver bus electrodes (unfired electrodes). The pattern for the light receiving surface electrodes was the same as that for the solar battery cells in Example 1.

Next, the pattern for the back surface electrodes was screen-printed on the back surface of the p-type polycrystalline silicon substrate with an aluminum (Al) paste, and the paste was dried at 100° C. to 300° C. (step S360). If the back surface electrodes are formed on the entire back surface of the p-type polycrystalline silicon substrate, the PECVD-SiN film serving as the back surface passivation film is broken during firing, and the passivation effect is lost. Therefore, the pattern for the back surface electrodes had a comb-like shape the same as that of the solar battery cells in Example 2.

Then the p-type polycrystalline silicon substrate was fired at, for example, 700° C. to 1,000° C. to form the back surface electrodes and to fire the light receiving surface electrodes (step S370). By performing the above steps, the solar battery cells in Comparative Example 2 having the same configuration as that of the solar battery cells in Example 2 were produced.

Figure 9:
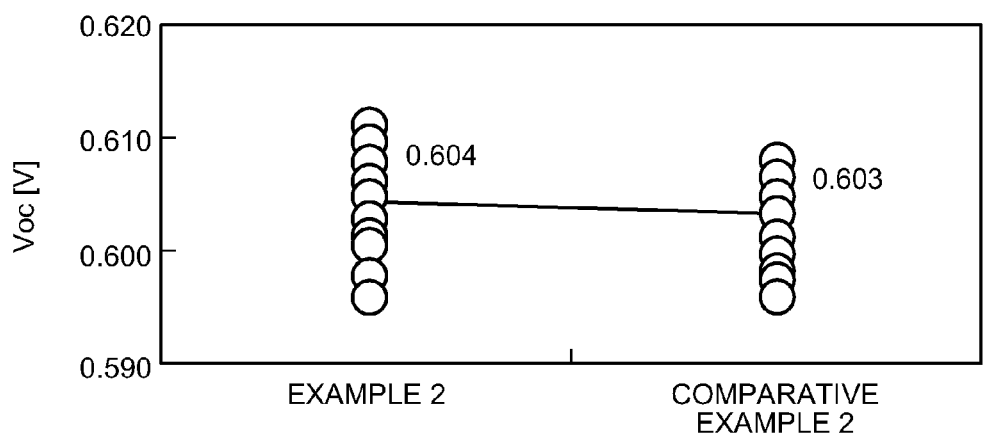
FIG. 9 is a characteristic diagram showing the open-circuit voltages Voc of solar battery cells.
Figure 10:
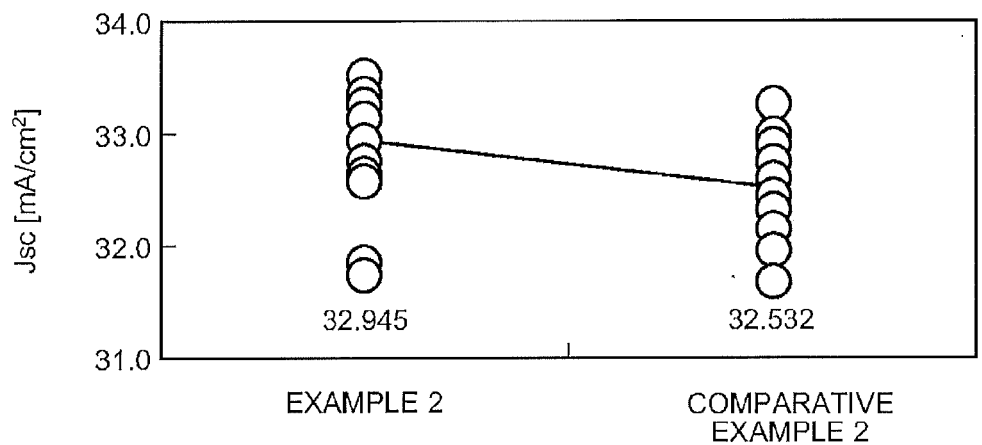
FIG. 10 is a characteristic diagram showing the short circuit photoelectric current densities Jsc of the solar battery cells.
Figure 11:
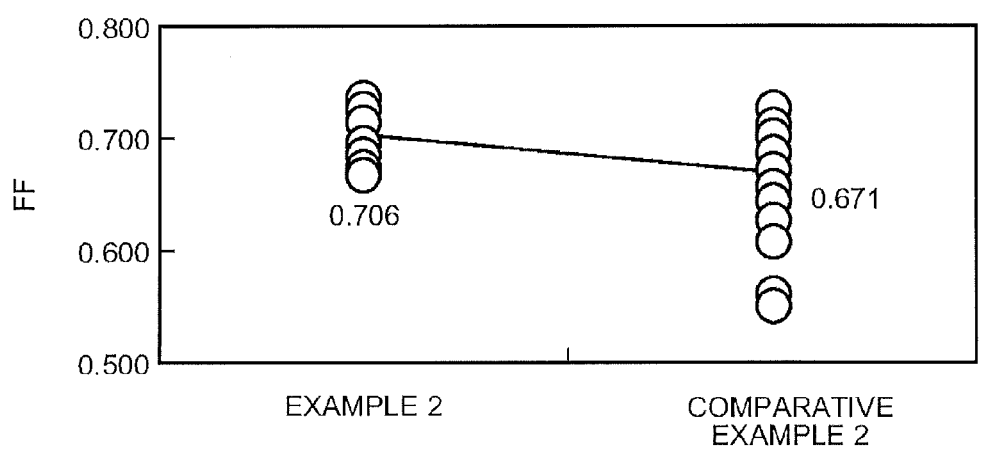
FIG. 11 is a characteristic diagram showing the fill factors FF of the solar battery cells.

The solar battery cells in Comparative Example 2 and the solar battery cells in Example 2 were used. Each solar battery cell was actually operated to measure its open-circuit voltage Voc (V), short-circuit photoelectric current density Jsc (mA/cm$^2$), and fill factor FF as the solar battery output characteristics. The results are shown in FIGS. 9 to 11. FIG. 9 is a characteristic diagram showing the open-circuit voltages Voc (V) of the solar battery cells. FIG. 10 is a characteristic diagram showing the short-circuit photoelectric current densities Jsc (mA/cm$^2$) of the solar battery cells. FIG. 11 is a characteristic diagram showing the fill factors FF of the solar battery cells. In the first embodiment, since the shapes of the back surface electrodes of the solar battery cells in Example 1 and Comparative Example 1 were different, the fill factors FF could not be compared. However, in the second embodiment, since the electrode shapes of the solar battery cells in Example 2 and Comparative Example 2 were the same, the fill factors FF could be compared.

As in FIGS. 4 and 5, the values in each figure are average values, and the average values are connected by a straight line. As can be seen from FIGS. 9 and 10, the values of the open-circuit voltage Voc (V) and short-circuit photoelectric current density Jsc (mA/cm$^2$) of the solar battery cells in Example 2 were substantially the same as those of the solar battery cells in Comparative Example 2. However, as can be seen from FIG. 11, the difference in fill factor FF between the solar battery cells in Example 2 and the solar battery cells in Comparative Example 2 was large. This showed that although the variations in fill factor FF in the conventional process shown in FIG. 8 were large, the fill factors FF obtained in the process according to the present invention were stable. This shows that the method for manufacturing a solar battery cell according to the present invention is better than the conventional process shown in FIG. 8 and can produce a solar battery having good output characteristics.

Figure 12:
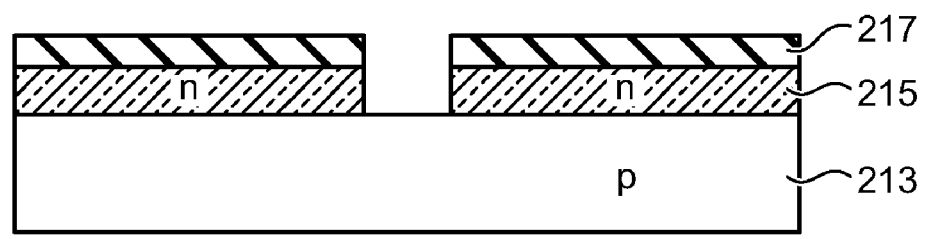
FIG. 12 is a cross sectional view illustrating the surface state of the solar battery cell in Comparative Example 2.

The difference in fill factor FF may be considered due to pinholes in a PECVD-SiN film as described above. As shown in FIG. 12, in the conventional process (Comparative Example 2) shown in FIG. 8, the entire p-type polycrystalline silicon substrate is immersed in a chemical solution when the back surface diffusion layer is removed in step S340. Therefore, the n-type diffusion layer 215 on the front surface may be removed at areas corresponding to pinholes formed in the PECVD-SiN film (antireflection film) 217 on the front surface of the p-type polycrystalline silicon substrate 213.

In such a case, the p-type polycrystalline silicon substrate 213 is exposed at the areas corresponding to the pinholes formed in the PECVD-SiN film (antireflection film) 217 on the front surface of the p-type polycrystalline silicon substrate 213. If electrodes are formed on the areas from which the n-type diffusion layer on the front surface has been removed, leak paths are created, causing deterioration in characteristics of the solar battery. FIG. 12 is a cross sectional view illustrating the surface state of a solar battery cell in Comparative Example 2.

Figure 13:
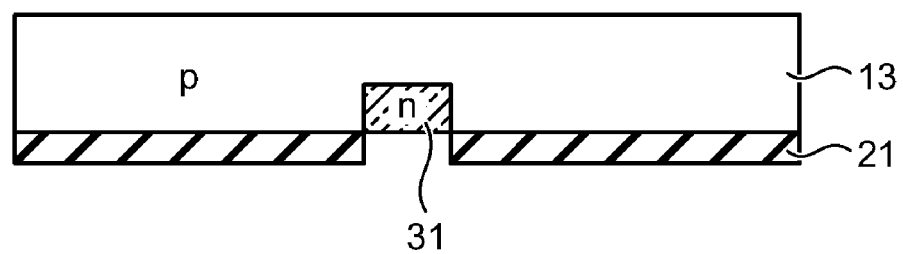
FIG. 13 is a cross sectional view illustrating the surface state of a solar battery cell in Example 2.

However, as shown in FIG. 13, in the method for manufacturing a solar battery cell according to the first embodiment (Example 2), an n-type diffusion layer 31 is formed at areas corresponding to pinholes in the back surface passivation film (PECVD-SiN film) 21 on the back surface of the p-type polycrystalline silicon substrate 13 during the diffusion layer forming step in step S130. FIG. 13 is a cross sectional view illustrating the surface state of a solar battery cell in Example 2.

Carriers generated by light are separated into electrons and holes at a pn junction. In the solar battery cell in Comparative Example 2, the most part of the front surface of the p-type polycrystalline silicon substrate 213 is the n-type diffusion layer 215. The ratio of the area occupied by the n-type diffusion layer 215 and the area occupied by the exposed portions of the p-type polycrystalline silicon substrate 213 to its front surface area can be "the n-type diffusion layer 215>the exposed portions of the p-type polycrystalline silicon substrate 213." Therefore, most of the carriers are separated into electrons and holes at the pn junction.

On the other hand, in the solar battery cell in Example 2, the n-type diffusion layer 31 is formed only on a part of the back surface of the p-type polycrystalline silicon substrate 13 and has a small area. The ratio of the area occupied by the n-type diffusion layer 31 and the area occupied by the back surface passivation film (PECVD-SiN film) 21 to the back surface area of the p-type polycrystalline silicon substrate 13 can be "the n-type diffusion layer 31<the back surface passivation film (PECVD-SiN film) 21." Therefore, the number of carriers separated at the pn junction between the n-type diffusion layer 31 and the p-type polycrystalline silicon substrate 13 is significantly less than the number of carriers separated at the pn junction between the n-type diffusion layer 15 on the front surface and the p-type polycrystalline silicon substrate 13. Therefore, in the solar battery cell in Example 2, even when the back surface electrodes 23 are located at areas corresponding to pinholes in the back surface passivation film (the back surface PECVD-SiN film), the number of carriers involved in recombination is small, and this may provide a stable fill factor FF.

Third Embodiment

In a third embodiment, the dependence on the properties of the PECVD-SiN film serving as the back surface passivation film was examined. For this purpose, solar battery cells in Example 3 were produced by depositing a PECVD-SiN film having a refractive index n of 2.0 on the back surface of a p-type polycrystalline silicon wafer to a thickness of 80 nm to 90 nm. In addition, solar battery cells in Example 4 were produced by depositing a PECVD-SiN film having a refractive index n of 2.2 on the back surface of a p-type polycrystalline silicon wafer to a thickness of 80 nm to 90 nm. The solar battery cells in Examples 3 and 4 were produced by the same process as that for the solar battery cells in Example 1. The structures of the solar battery cells in Examples 3 and 4 were the same as the configuration of the solar battery cells in Example 1, and the size of each battery cell was 4 cm$^2$.

Conventional solar battery cells (Comparative Example 3) each having an Al-BSF layer disposed on the back surface of the solar battery substrate as shown in FIG. 6 were produced by the process shown in FIG. 7 for comparison. The size of the solar battery cells was 4 cm$^2$, which was the same as the size of the solar battery cells in Examples 3 and 4.

Figure 14:
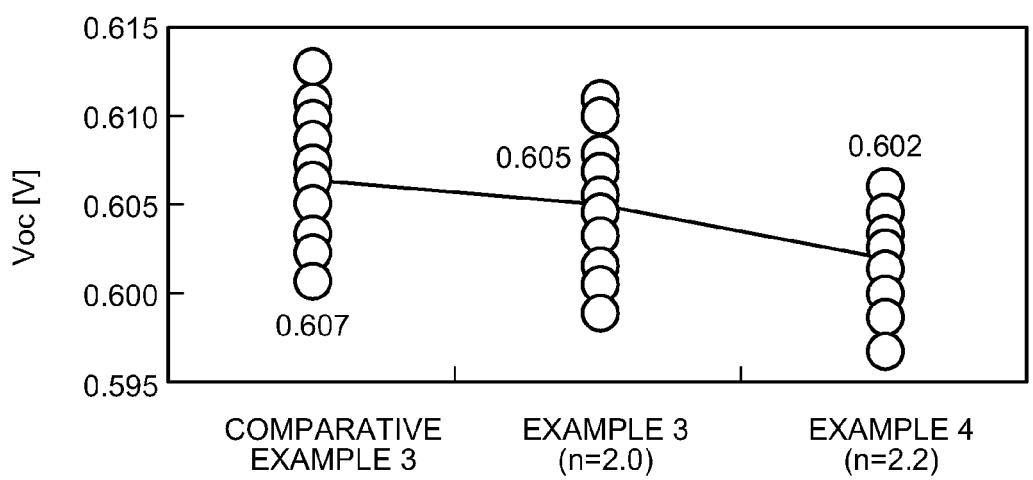
FIG. 14 is a characteristic diagram showing the open-circuit voltages Voc of solar battery cells.
Figure 15:
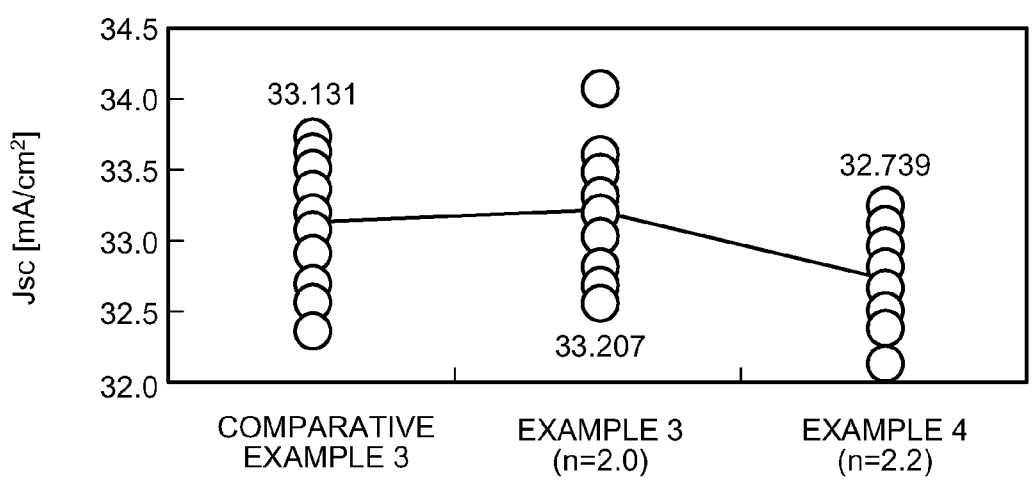
FIG. 15 is a characteristic diagram showing the short circuit photoelectric current densities Jsc of the solar battery cells.

The solar battery cells in Examples 3 and 4 and the solar battery cells in Comparative Example 3 were used. Each solar battery cell was actually operated to measure its open-circuit voltage Voc (V) and short-circuit photoelectric current density Jsc (mA/cm$^2$) as the solar battery output characteristics. The results are shown in FIGS. 14 and 15. FIG. 14 is a characteristic diagram showing the open-circuit voltages Voc (V) of the solar battery cells. FIG. 15 is a characteristic diagram showing the short-circuit photoelectric current densities Jsc (mA/cm$^2$) of the solar battery cells. As in FIGS. 4 and 5, the values in each figure are average values, and these average values are connected by a straight line.

Figure 16:
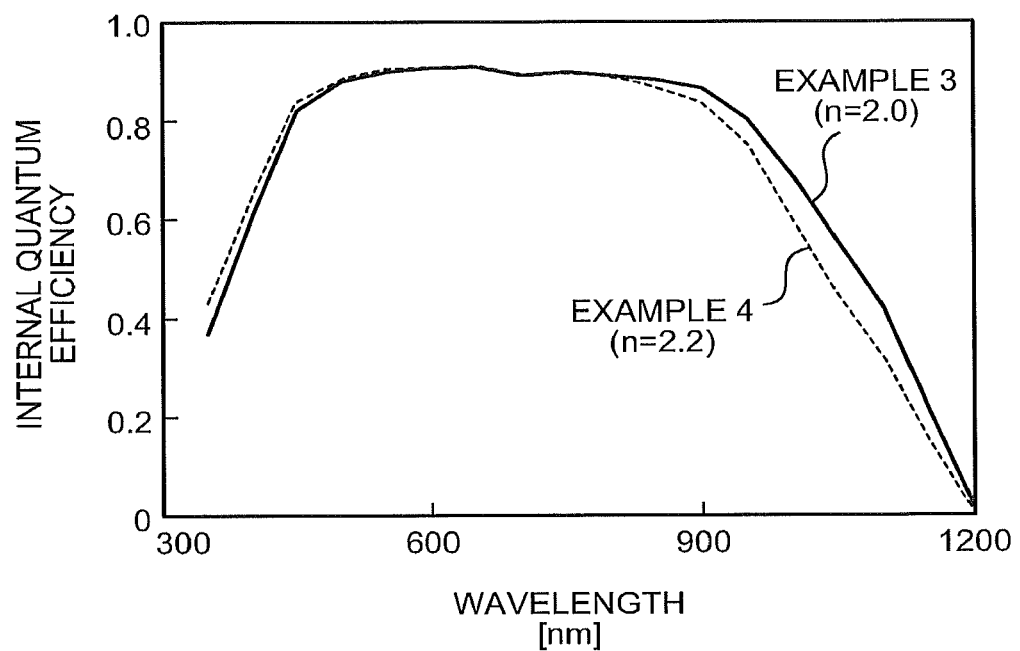
FIG. 16 is a characteristic diagram showing the internal quantum efficiencies of solar battery cells in Example 3 and Example 4.
Figure 17:
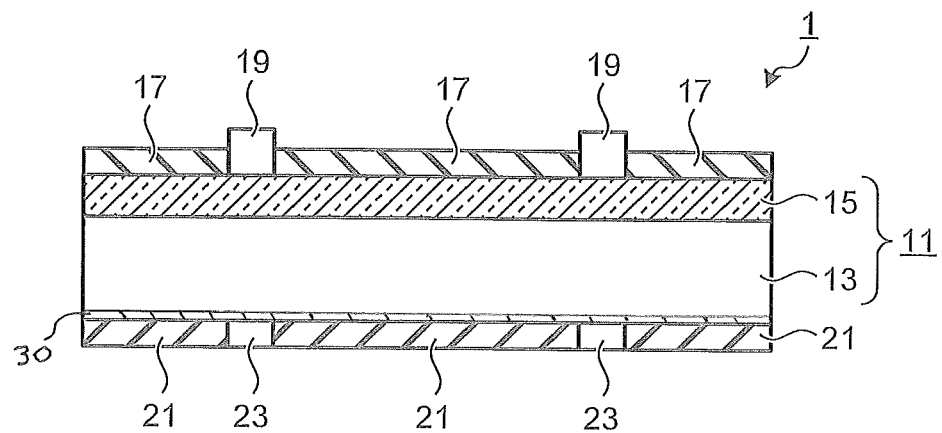
FIG. 17 is a cross-sectional view illustrating the schematic configuration of a solar battery cell produced by the method for manufacturing a solar battery cell according to a fifth embodiment of the present invention.

As can be seen from FIGS. 14 and 15, the characteristics of the solar battery cells in Example 4 in which the PECVD-SiN film having a refractive index n of 2.2 was used as the back surface passivation film were worse than those of the solar battery cells in which the PECVD-SiN film having a refractive index n of 2.0 was used as the back surface passivation film. To examine the above results in more detail, the results of measurement of the internal quantum efficiency of each of the solar battery cells in Examples 3 and 4 are shown in FIG. 16. FIG. 16 is a characteristic diagram showing the internal quantum efficiency of each of the solar battery cells in Examples 3 and 4.

As can be seen from FIG. 16, the sensitivity at wavelengths longer than 900 nm was higher in the solar battery cell in Example 3 in which the PECVD-SiN film having a refractive index n of 2.0 was used, and the passivation characteristics in Example 3 were better. This may be because a stoichiometric silicon nitride film ($Si_3N_4$) has a refractive index n of 2.05 and the PECVD-SiN film having a refractive index n of 2.0, which is closer to 2.05, is closer to the stoichiometric silicon nitride film. Therefore, the PECVD-SiN film having a refractive index n of 2.0 is particularly preferred as the back surface passivation film. Although the PECVD-SiN film having a refractive index n of 2.2 can be used as the back surface passivation film, the PECVD-SiN film having a refractive index n of 2.0 is more preferred.

Since a silicon nitride film deposited by thermal CVD is $Si_3N_4$, similar effects may be obtained when this film is used instead of the PECVD-SiN film used as the back surface passivation film.

Fourth Embodiment

In each of the first to third embodiments, descriptions have been given of the case in which an aluminum (Al) paste is used to form the back surface electrodes. However, when solar battery cells are connected to each other to form a module, it is preferable to use a silver aluminum (AgAl) paste to form back surface electrodes.

In conventional solar battery cells, the back surface electrodes must be formed of aluminum (Al) because a BSF layer is formed on the back surface of a p-type polycrystalline silicon wafer. Moreover, in consideration of mutual connection of solar battery cells, silver (Ag) electrodes for mutual connection must be provided on the back surface of the p-type polycrystalline silicon wafer. However, in the method for manufacturing a solar battery cell according to the first to third embodiments, since the back surface of the p-type polycrystalline silicon wafer is passivated with a PECVD-SiN film, the back surface electrodes may not be formed of aluminum (Al).

A solar battery cell can be produced by forming comb-like electrodes using a combination of aluminum (Al) electrodes and silver (Ag) electrodes, i.e., by forming comb-like aluminum (Al) electrodes and then providing silver (Ag) for mutual connection, as in a conventional method. However, the use of a solderable silver aluminum (AgAl) paste can omit the step of printing with a silver (Ag) paste for mutual connection, and this can contribute to the simplification of the steps and a reduction in cost.

Fifth Embodiment

In the first to third embodiments, the back surface of the p-type polycrystalline silicon substrate is passivated with a PECVD-SiN film serving as the back surface passivation film. However, a silicon oxide film 30 deposited by the PECVD method (hereinafter denoted as a PECDV-SiO film) may be inserted between the PECVD-SiN film and silicon (Si). It is generally known that a good interface with less levels, i.e., less recombination centers, is formed between a silicon oxide film (SiO) and silicon (Si), particularly between a silicon oxide film (SiO) formed by thermal oxidation and silicon (Si).

Therefore, by inserting a silicon oxide film formed by the PECVD method between a PECVD-SiN film and silicon (Si), the passivation characteristics on the back surface of the p-type polycrystalline silicon substrate are further improved. The reason that the inserted film is limited to a PECVD-SiO film is that such a film can be formed at low temperatures using an apparatus having relatively high mass productivity and that the PECVD-SiO film and the PECVD-SiN film can be deposited continuously.

When a PECVD-SiN film is deposited on a PECVD-SiO film deposited on the back surface of a p-type polycrystalline silicon substrate, the PECVD-SiN film serves as a mask when an n-type diffusion layer is formed and also serves as a protection film for protecting the PECVD-SiO film. Generally, before the formation of an n-type diffusion layer, preprocessing using hydrofluoric acid (HF) is preformed to remove a naturally oxidized film formed on the front surface of a p-type polycrystalline silicon substrate. However, since the PECVD-SiN film functions as a protection film, the dissolution of the PECVD-SiO film in this step can be prevented.

Silane and disilane, for example, can be used as a deposition raw material for forming the PECVD-SiO film. Tetraoxy silane (TEOS) is not suitable for the deposition raw material. If TEOS is used, carbon may remain at the boundary between the PECVD-SiO film and silicon (Si), and this may cause deterioration in boundary characteristics.

INDUSTRIAL APPLICABILITY

As described above, the method for manufacturing a solar battery cell according to the present invention is useful for manufacturing a solar battery including a polycrystalline silicon substrate serving as a solar battery substrate with a reduced thickness.

The invention claimed is:

1. A method for manufacturing a solar battery cell, the method comprising:
   a first step of forming a passivation film on a first surface of a crystalline silicon substrate of a first conductive type;
   a second step, after the first step, of diffusing an element of a second conductive type into a second surface of the crystalline silicon substrate by thermal diffusion to form a diffusion layer, whereby a pn junction is formed;
   a third step of forming an antireflection film on the diffusion layer;
   a fourth step of disposing a first electrode paste on the second surface of the crystalline silicon substrate;
   a fifth step of disposing a second electrode paste on the passivation film; and
   a sixth step of firing the first electrode paste and the second electrode paste to form electrodes.

2. The method for manufacturing a solar battery cell according to claim 1, wherein
   the crystalline silicon substrate of the first conductive type is a p-type polycrystalline silicon substrate, the diffusion layer is an n-type diffusion layer, and
   a silver aluminum (AgAl) paste is used as the second electrode paste.

3. The method for manufacturing a solar battery cell according to claim 1, further comprising, before the first step, a step of forming a silicon oxide film on the first side of the crystalline silicon substrate of the first conductive type by plasma CVD, and wherein in the first step, the passivation film is formed on the silicon oxide film.

4. The method for manufacturing a solar battery cell according to claim 1, wherein the passivation film and the antireflection film are composed of a silicon nitride film.

5. The method for manufacturing a solar battery cell according to claim 4, wherein the passivation film and the antireflection film each are a silicon nitride film having a refractive index of 2.0 to 2.2.

6. The method for manufacturing a solar battery cell according to claim 4, wherein the silicon nitride film is formed by plasma CVD.

7. The method of claim 1, wherein the passivation film has a refractive index comparable to that of the antireflection film.

* * * * *